(12) United States Patent
Li et al.

(10) Patent No.: US 10,365,313 B2
(45) Date of Patent: Jul. 30, 2019

(54) BROKEN CONDUCTOR DETECTION METHOD AND APPARATUS

(71) Applicant: Siemens Aktiengesellschaft, Munich (DE)

(72) Inventors: Xin Dong Li, Nanjing (CN); Andre Smit, Raleigh, NC (US)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 150 days.

(21) Appl. No.: 15/314,539

(22) PCT Filed: Jul. 17, 2014

(86) PCT No.: PCT/CN2014/082433
§ 371 (c)(1),
(2) Date: Nov. 29, 2016

(87) PCT Pub. No.: WO2016/008143
PCT Pub. Date: Jan. 21, 2016

(65) Prior Publication Data
US 2018/0259567 A1    Sep. 13, 2018

(51) Int. Cl.
*G01R 31/08* (2006.01)
*G01R 31/02* (2006.01)

(52) U.S. Cl.
CPC ......... *G01R 31/086* (2013.01); *G01R 31/021* (2013.01); *G01R 31/026* (2013.01)

(58) Field of Classification Search
CPC .. G01R 31/086; G01R 31/021; G01R 31/026; G01R 31/08
See application file for complete search history.

(56) References Cited

U.S. PATENT DOCUMENTS 3,958,153 A  5/1976  Narayan
4,796,147 A  1/1989  Anderson
(Continued)

FOREIGN PATENT DOCUMENTS

CN    101046499 A    10/2007
CN    102184625 A    9/2011
(Continued)

OTHER PUBLICATIONS

Russian Office Action and English translation thereof dated Feb. 15, 2018.

(Continued)

*Primary Examiner* — Thang X Le
(74) *Attorney, Agent, or Firm* — Harness, Dickey & Pierce, P.L.C.

(57) ABSTRACT

A broken conductor detection method and apparatus are disclosed. In one embodiment, the apparatus includes a measurement module to measure, at a node of a distribution system, a voltage value of each distribution feeder of the distribution system; a check module to check whether the measured voltage value of each distribution feeder is less than a voltage threshold used for the distribution feeder, the voltage threshold used for the distribution feeder being calculated based on a mean value of measured voltage values of other distribution feeders in the distribution system; a generating module to, upon a checking result indicating that a measured voltage value of a distribution feeder of the distribution system is less than the voltage threshold used for the distribution feeder, generate a signal indicating that the distribution feeder of the distribution system has a broken conductor; and a sending module to send the generated signal.

8 Claims, 7 Drawing Sheets

(56) References Cited

U.S. PATENT DOCUMENTS

| | | | |
|---|---|---|---|
| 8,723,527 B2* | 5/2014 | Kudo | B60L 3/0046 |
| | | | 324/433 |
| 2003/0085715 A1 | 5/2003 | Lubkeman | |
| 2003/0205460 A1* | 11/2003 | Buda | H01J 37/32935 |
| | | | 204/192.13 |
| 2008/0116992 A1* | 5/2008 | Kishigami | H04L 1/24 |
| | | | 333/101 |
| 2012/0306507 A1* | 12/2012 | Fujimatsu | G01R 31/3835 |
| | | | 324/434 |
| 2013/0049764 A1* | 2/2013 | Koliwad | G01R 31/086 |
| | | | 324/522 |
| 2014/0077820 A1 | 3/2014 | Al-Ghannam | |

FOREIGN PATENT DOCUMENTS

| | | |
|---|---|---|
| CN | 102638731 A | 8/2012 |
| CN | 102707194 A | 10/2012 |
| CN | 102879711 A | 1/2013 |
| CN | 103308823 A | 9/2013 |
| EP | 0276181 A1 | 7/1988 |
| JP | H02236176 A | 9/1990 |
| JP | H1164420 A | 3/1999 |
| RU | 2281455 C1 | 9/2005 |
| RU | 84132 U1 | 6/2009 |
| WO | WO 03016850 A2 | 2/2003 |

OTHER PUBLICATIONS

Extended European Search Report dated Feb. 16, 2018.
International Search Report and Written Opinion dated Apr. 27, 2015.

* cited by examiner

BROKEN CONDUCTOR DETECTION METHOD AND APPARATUS

PRIORITY STATEMENT

This application is the national phase under 35 U.S.C. § 371 of PCT International Application No. PCT/CN2014/082433 which has an International filing date of Jul. 17, 2014, which designated the United States of America, the entire contents of which are hereby incorporated herein by reference.

FIELD

Embodiments of present invention generally relate to a distribution system, and to a broken conductor detection method and apparatus used in a distribution system.

BACKGROUND

Power generated by generating equipment is usually delivered in the form of an alternating current to a load by using a distribution system. The power supply function of the distribution system is implemented by using distribution feeders. Therefore, if a distribution feeder in the distribution system has a broken conductor, the distribution system fails, and cannot supply power normally. To make sure that the distribution system supplies power normally, a broken conductor detection technology needs to be used so that a broken conductor of a distribution feeder can be detected when it appears in the distribution system.

At present, the negative phase sequence current detection method is widely used to detect whether a distribution feeder in a distribution system has a broken conductor. In the negative phase sequence current detection method, a negative phase sequence current and a positive phase sequence current of the distribution feeder are first detected, and then a ratio of the detected negative phase sequence current to the detected positive phase sequence current is calculated; after that, it is determined whether the calculated ratio is greater than a constant (generally 50%). and if yes, it is considered that the distribution feeder has a broken conductor.

It can be seen that, the negative phase sequence current detection method is highly dependent on a current flowing through a distribution feeder during the broken conductor detection. However, in some cases of a broken conductor of a distribution feeder, for example, if the broken conductor of the feeder is lying on a highly resistive surface of a paved road or if the feeder having the broken conductor, which appears at the end of the distribution system, hangs in the air. no current (neither negative phase sequence current nor a positive phase sequence current) flows through me distribution feeder. Therefore, the negative phase sequence current detection method is not applicable to detect all conductor-broken situations of distribution feeders. In addition, the negative phase sequence current detection method cannot locate the broken conductor of the distribution feeder either.

SUMMARY

At least one embodiments of the present invention provides a broken conductor detection method and apparatus, which can improve the broken conductor detection for a distribution feeder in a distribution system.

A broken conductor detection method according to an embodiment of the present invention includes: measuring, at a node of a distribution system, a voltage value of each distribution feeder of the distribution system; checking whether the measured voltage value of each distribution feeder T of the distribution system is less than a voltage threshold used for the distribution feeder T, the voltage threshold used for the distribution feeder T being calculated based on a mean value of measured voltage values of other distribution feeders in the distribution system; if a checking result indicates that a measured voltage value of a distribution feeder of the distribution system is less than the voltage threshold used for the distribution feeder, generating a signal indicating that the distribution feeder of the distribution system has a broken conductor; and, sending the generated signal.

In an embodiment, the signal is a voltage-detection-based signal indicating that the distribution feeder has a broken conductor, and the method further includes: measuring, at the node, a current value of each distribution feeder of the distribution system; checking whether the measured current value of the distribution feeder T is less than a current threshold used for the distribution feeder T, the current threshold used for the distribution feeder T being calculated based on a mean value of measured current values of other distribution feeders in the distribution system; if a checking result indicates that a measured current value of a distribution feeder in the distribution system is less than the current threshold used for the distribution feeder, generating a current-detection-based signal indicating that the distribution feeder has a broken conductor; and, sending off the generated current-detection-based signal indicating that the distribution feeder has a broken conductor.

A broken conductor detection method according to an embodiment of the present invention includes: receiving, from at least one device of devices located on nodes of a distribution system, a signal indicating that a distribution feeder of the distribution system has a broken conductor; determining, based on the received signal, that the distribution feeder m the distribution system has a broken conductor, searching, from alt the nodes of the distribution system, for two neighboring nodes satisfying the following condition: the signal indicating that the distribution feeder has a broken conductor is only received from one of the two neighboring nodes; and, determining that the broken conductor of the distribution feeder appears between the two nodes found.

In an embodiment, the received signal includes a voltage-detection-based signal indicating that the distribution feeder has a broken conductor and a current-detection-based signal indicating that the distribution feeder has a broken conductor; and, the two nodes found satisfy the following condition: the voltage-detection-based signal indicating that the distribution feeder has a broken conductor is only received from one of the two nodes found.

A broken conductor detection apparatus according to an embodiment of the present invention includes: a measurement module, used to measure, at a node of a distribution system, a voltage value of each distribution feeder of the distribution system; a check module, used to check whether the measured voltage value of each distribution feeder T of the distribution system is less than a voltage threshold used for the distribution feeder T, the voltage threshold used for the distribution feeder T being calculated based on a mean value of measured voltage values of other distribution feeders in the distribution system; a generating module, used to: if a checking result indicates that a measured voltage value of a distribution feeder of the distribution system is less than the voltage threshold used for the distribution feeder, generate a signal indicating that the distribution feeder of the distribution system has a broken conductor, and, a sending module, used to send the generated signal.

In an embodiment, the signal is a voltage-detection-based signal indicating that the distribution feeder has a broken conductor, and the measurement module is further used to: measure at the node, a current value of each distribution feeder of the distribution system; the check module is further used to check whether the measured current value of the distribution feeder T is less man a current threshold used for the distribution feeder T, the current threshold used for the distribution feeder T being calculated based on a mean value of measured current values of other distribution feeders in the distribution system; the generating module is further used to: if a checking result indicates that a measured current value of a distribution feeder in the distribution system is less than the current threshold used for the distribution feeder, generate a current-detection-based signal indicating that the distribution feeder has a broken conductor; and the sending module is further used to send the generated current-detection-based signal indicating that the distribution feeder has a broken conductor.

A broken conductor detection apparatus according to an embodiment of the present invention includes: a receiving module, used to receive, from at least one device of devices located on nodes of a distribution system, a signal indicating that a distribution feeder of the distribution system has a broken conductor; a judging module, used to determine, based on the received signal, that the distribution feeder in the distribution system has a broken conductor, a search module, used to search, from all the nodes of the distribution system, for two neighboring nodes satisfying the following condition: the signal indicating that the distribution feeder has a broken conductor is only received from one of the two neighboring nodes; and, a determining module, used to determine that the broken conductor of the distribution feeder appears between the two nodes found.

In an embodiment, the received signal includes a voltage-detection-based signal indicating that the distribution feeder has a broken conductor and a current-detection-based signal indicating that the distribution feeder has a broken conductor, and the two nodes found satisfy the following condition: the voltage-detection-based signal indicating that the distribution feeder has a broken conductor is only received from one of the two nodes found.

A distribution system according to an embodiment of the present invention includes multiple distribution feeders; multiple nodes; and multiple devices, each of the multiple devices being located on one of the multiple nodes; and a server that communicates with the multiple devices in a wired or wireless manner, where each of the multiple devices is used to: measure, at a node where it is located, voltage values of the multiple distribution feeders; check whether the measured voltage value of each distribution feeder T of the multiple distribution feeders is less than a voltage threshold used for the distribution feeder T, the voltage threshold used for the distribution feeder T being calculated based on a mean value of measured voltage values of other distribution feeders among the multiple distribution feeders; and if a checking result indicates that the measured voltage value of a distribution feeder among the multiple distribution feeders is less than the voltage threshold used for the distribution feeder, generate a signal indicating that the distribution feeder has a broken conductor and send the signal to the server; the server is used to receive, from at least one device of the multiple devices, the signal indicating that the distribution feeder has a broken conductor, and determine, according to the received signal, that the distribution feeder has a broken conductor.

In an embodiment, the server is used to search, from the multiple nodes, for two neighboring nodes satisfying the following condition: the signal indicating that the distribution feeder has a broken conductor is only received from one of the two neighboring nodes. The server is further used to determine that the broken conductor of the distribution feeder appears between the two nodes found.

It can be seen from the above description that, the solution of the embodiments of the present invention implements broken conductor detection by utilizing the fact that when a part of distribution feeders of a distribution system has a broken conductor, starting from the location where the broken conductor appears, voltages of the distribution feeders are asymmetric at a side away from generating equipment (power source). Therefore, compared with the prior art, the solution of the embodiments of the present invention can improve the broken conductor detection for a distribution feeders of a distribution system.

BRIEF DESCRIPTION OF THE DRAWINGS

Other characteristics, features, advantages, and benefits of the present invention will become clearer through the following detailed description with reference to the accompanying drawings.

DETAILED DESCRIPTION OF THE EXAMPLE EMBODIMENTS

Through lots of observation and research, the inventors find that: if a part of distribution feeders of the distribution system has a broken conductor, starting from a location where the broken conductor appears, at a side close to generating equipment (power source), voltages of the distribution feeders of the distribution system are symmetric, while starting from the location where the broken conductor appears, at a side away from the generating equipment (power source), voltages of the distribution feeders of the distribution system are asymmetric, and a voltage of the distribution feeder having the broken conductor is less than a product of a mean value of voltages of other distribution feeders of the distribution system and a constant, where the constant may be determined by means of actual detections. The inventors propose the solutions of the embodiments of the present invention based on the above discovery.

The following describes the embodiments of the present invention in detail with reference to the accompanying drawings.

Figure 1:
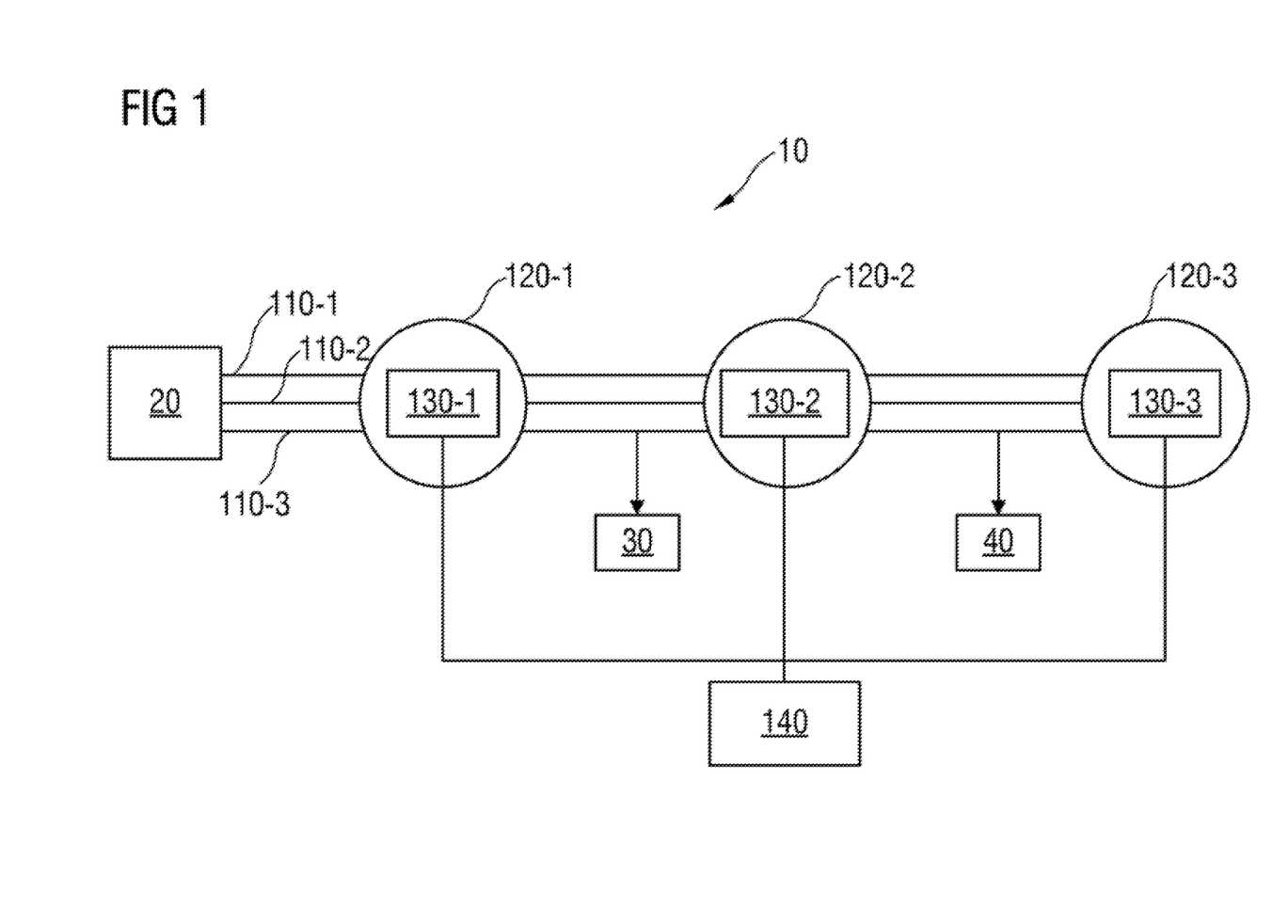
FIG. 1 is a schematic architecture diagram of a distribution system according to an embodiment of the present invention.

FIG. 1. is a schematic architecture diagram of a distribution system according to an embodiment of the present invention. As shown in FIG. 1, a distribution system 10 delivers electric energy from a power source 20 to a load 30 and a load 40.

As shown in FIG. 1, the distribution system 10 may include three distribution feeders 110-1, 110-2, and 110-3, and three nodes 120-1, 120-2, and 120-3. The distribution feeders 110-1, 110-2, and 110-3 are used for different phases. The nodes 120-1 and 120-2 are adjacent to each other and the nodes 120-2 and 120-3 are adjacent to each other; the nodes 120-1, 120-2, and 120-3 may be wire poles or high-voltage pylons.

The distribution system 10 may further include distribution automation devices 130-1, 130-2, and 130-3. The distribution automation devices 130-1, 130-2, and 130-3 are placed in the nodes 120-1, 120-2, and 120-3, respectively. The distribution system 10 may further include a server 140, where the server 140 can communicate with the distribution automation devices 130-1, 130-2, and 130-3 in a wired or wireless manner.

Figure 2:
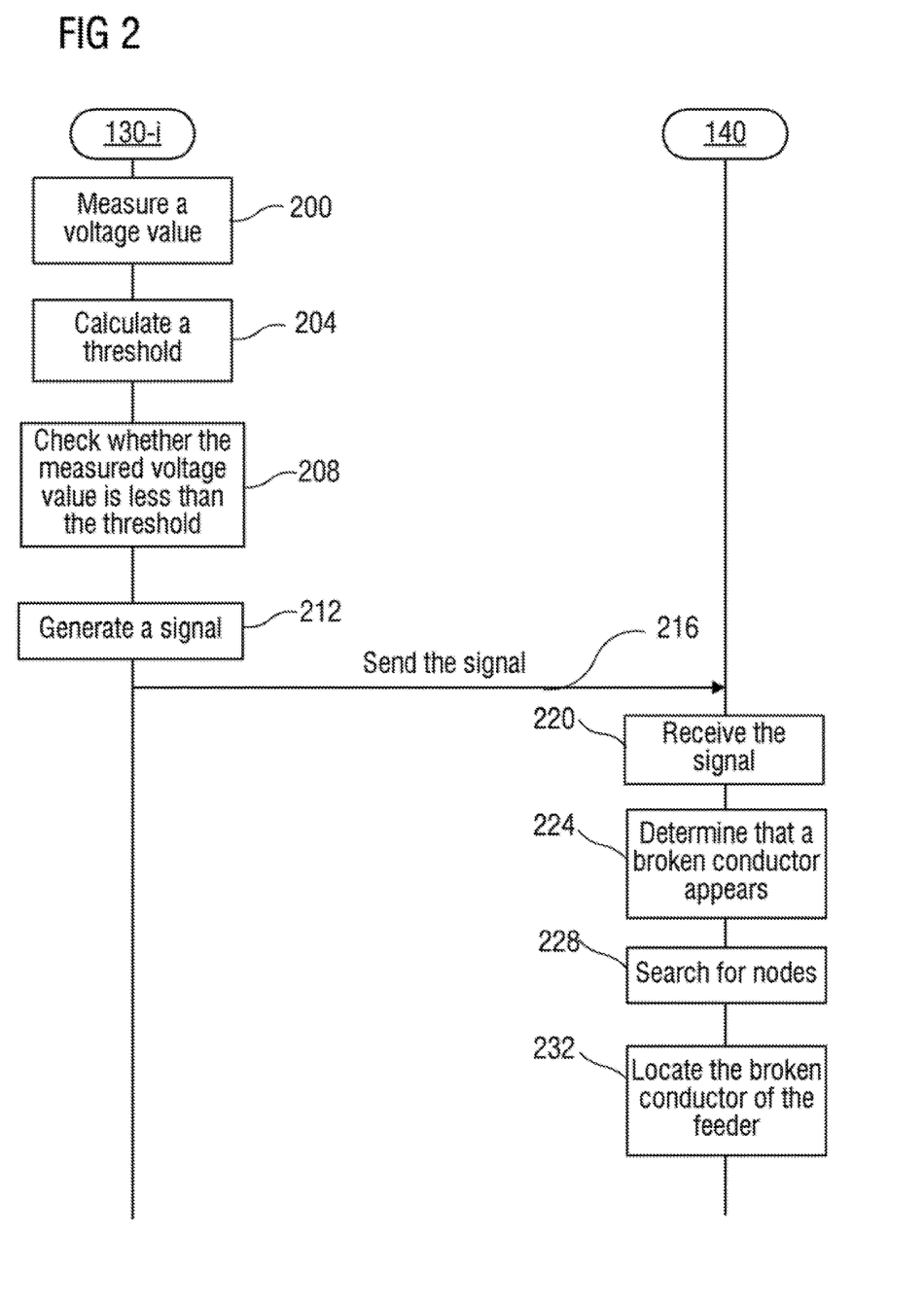
FIG. 2 is a flowchart of a broken conductor detection method according to an embodiment of the present invention.

FIG. 2 is a schematic diagram of a broken conductor detection method according to an embodiment of the present invention. As shown in FIG. 2, in block S200, each distribution automation device 130-$i$ of the distribution automation devices 130-1, 130-2, and 130-3 measures, at a node where it is located, respective voltage values of the distribution feeders 110-1, 110-2, and 110-3. The distribution automation device 130-$i$ may periodically perform the measurement or perform me measurement after receiving a measurement indication from the server 140.

In block S204, the distribution automation device 130-$i$ calculates a voltage threshold used for each distribution feeder 110-$i$ of the distribution feeders 110-1, 110-2, and 110-3, where the voltage threshold UTH-1 used for the distribution feeder 110-$i$ is equal to a product of a mean value of measured voltage values of other distribution feeders and a specified constant, and the specified constant may be determined by means of actual detections, is greater than 0 and less than 1, and is preferably 0.1. Specifically, the voltage threshold UTH-1 used for each distribution feeder 110-$i$ may be calculated by using the following equation:

$$UTH\text{-}1 = KU\min*[(Uaa+Ubb)/2]$$

where KUmin is the specified constant, and Uaa and Ubb are the measured voltage values of other two distribution feeders in the distribution system 10, except the distribution feeder 110-$i$.

In block S208, the distribution automation device 130-$i$ checks whether the measured voltage value of each distribution feeder 110-$i$ of the distribution feeders 110-1, 110-2, and 110-3 is less than the voltage threshold UTH-1 used for me distribution feeder 1104.

In block S212, if a checking result in block S208 indicates that a measured voltage value of any distribution feeders 110-1, 110-2, or 110-3 is less than the voltage threshold used for the distribution feeder, the distribution automation device 1304 generates a signal indicating that the distribution feeder has a broken conductor.

For example, if the checking result indicates that the measured voltage value of the distribution feeder 110-1 is less than the voltage threshold used for the distribution feeder 110-1, a signal indicating that the distribution feeder 110-1 has a broken conductor is generated; if the checking result indicates that the measured voltage value of the distribution feeder 110-2 is less than the threshold value used for the distribution feeder 110-2, a signal indicating that the distribution feeder 110-2 has a broken conductor is generated; if the checking result indicates that the measured voltage value of the distribution feeder 110-3 is less than the voltage threshold used for the distribution feeder 110-3, a signal indicating that the distribution feeder 310-3 has a broken conductor is generated; if the checking result indicates that the measured voltage value of the distribution feeder 110-1 is less than the voltage threshold used for the distribution feeder 110-1 and that the measured voltage value of the distribution feeder 110-2 is less than the threshold voltage used for the distribution feeder 110-2, a signal indicating that the distribution feeder 110-1 has a broken conductor and a signal indicating that the distribution feeder 110-2 has a broken conductor are generated; if the checking result indicates that the measured voltage value of the distribution feeder 110-1 is less than the voltage threshold of the distribution feeder 110-1 and that the measured voltage value of the distribution feeder 110-3 is less than the voltage threshold of the distribution feeder 110-3. a signal indicating that the distribution feeder 110-1 has a broken conductor and a signal indicating that the distribution feeder 110-3 has a broken conductor are generated; and if the checking result indicates that the measured voltage value of the distribution feeder 110-2 is less than the voltage threshold used for the distribution feeder 110-2 and that the measured voltage value of the distribution feeder 110-3 is less than the voltage threshold used for the distribution feeder 110-3, a signal indicating that the distribution feeder 110-2 has a broken conductor and a signal indicating that the distribution feeder 110-3 has a broken conductor are generated.

In block S216, the distribution automation device 130-$i$ sends the generated signal to the server 140.

In block S220, the server 140 receives the signal which is sent by the distribution automation device 130-$i$ and indicates that the distribution feeder of the distribution system 10 has a broken conductor.

In block S224, based on the received signal indicating that the distribution feeder of the distribution system 10 has a broken conductor, the server 140 determines that the distribution feeder has a broken conductor.

For example, if the signal indicating that the distribution feeder 110-1 has a broken conductor is received from at least one of the distribution automation devices 130-1, 130-2, and 130-3, the server 140 determines that the distribution feeder 110-1 has a broken conductor; if the signal indicating that the distribution feeder 110-2 has a broken conductor is received from at least one of the distribution automation devices 130-1, 130-2, and 130-3, the server 140 determines that the distribution feeder 110-2 has a broken conductor; and if the signal indicating that the distribution feeder 110-3 has a broken conductor is received from at least one of the distribution automation devices 130-1, 130-2, and 130-3, the server 140 determines that the distribution feeder 110-3 has a broken conductor.

In block S228, the server 140 searches, from the nodes 120-1, 120-2, and 120-3. two neighboring nodes satisfying the following condition: the server 140 receives the signal indicating that the distribution feeder has a broken conductor from a distribution automation device located on one of the two neighboring nodes, and does not receive the signal indicating that the distribution feeder has a broken conductor from a distribution automation device located on the other of the two neighboring nodes, that is, the server 140 only receives the signal indicating that the distribution feeder has a broken conductor from a distribution automation device on one of the two neighboring nodes.

For example, if the server 140 only receives the signal indicating that the distribution feeder has a broken conductor from the distribution automation device located on one of the neighboring nodes 120-1 and 12-02, the node 12-01 and node 12-02 are the nodes to be found; and if the server 140 only receives the signal indicating that the distribution feeder has a broken conductor from the distribution automation device located on one of the neighboring nodes 120-2 and 120-3. The node 120-2 and node 120-3 are the nodes to be found.

In block S232, the server HO determines that the broken conductor of the distribution feeder appears between the two neighboring nodes found.

Figure 3A:
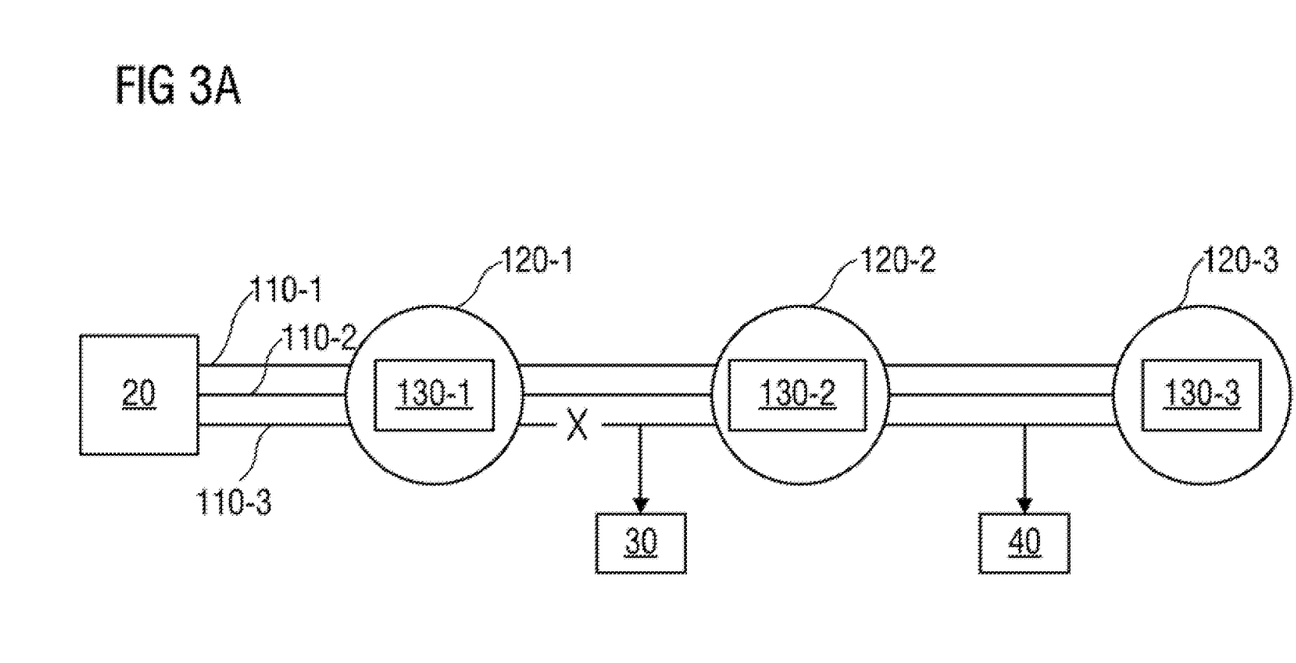
FIG. 3A shows a first example of a distribution feeder having a broken conductor.

FIG. 3A shows a first example of a distribution feeder having a broken conductor. As shown in FIG. 3A, the distribution feeder 110-3 between the node 120-1 and node 12-02 of the distribution system 10 has a broken conductor.

Because the broken conductor of the distribution feeder 110-3 appears between the node 120-1 and node 120-2 of the distribution system 10, at the node 120-1, a voltage of the distribution feeder 110-3 is not affected by the broken conductor and remains unchanged, and therefore, at the node 120-1. Voltages of the three distribution feeders 110-1, 110-2, and 110-3 are still symmetric. However, at the node 12-02 and node 12-03, a voltage of the distribution feeder 110-3 is affected by the broken conductor and becomes zero, while voltages of the distribution feeders 110-1 and 110-2 remain unchanged, and therefore, at the node 120-2 and node 120-3, the voltages of the three distribution feeders 110-1, 110-2, and 110-3 become asymmetric.

Because the voltages of the three distribution feeders 110-1, 110-2, and 110-3 are still symmetric at the node 120-1, the distribution automation device 130-1 located on the node 120-1 finds that, at the node 120-1, the measured voltage value of each of the distribution feeders 110-1, 110-2, and M 0-3 is not less than the voltage threshold thereof, and therefore, the distribution automation device 130-1 does not generate a signal indicating that a distribution feeder has a broken conductor, which means that the distribution automation device 130-1 does not send a signal indicating that the distribution feeder 110-3 has a broken conductor to the server 140.

At the node 120-2, the voltage of the distribution feeder 110-3 is affected by the broken conductor and becomes zero, while the voltages of the distribution feeders 110-1 and 110-2 remain unchanged, that is, at the node 120-2, the voltages of the three distribution feeders 110-1, 110-2, and 110-3 become asymmetric. Therefore, the distribution automation device 130-2 located on the node 120-2 finds that, at the node 120-2, the measured voltage value of the distribution feeder 110-3 is less than the voltage threshold used for the distribution feeder 110-3, so the distribution automation device 130-2 generates a signal indicating that the distribution feeder 110-3 has a broken conductor and sends the signal to the server 140.

At the node 120-3, the voltage of the distribution feeder 110-3 is affected by the broken conductor and becomes zero, while the voltages of the distribution feeders 110-1 and 110-2 remain unchanged, that is, at the node 120-3, the voltages of the three distribution feeders 110-1, 110-3, and 110-3 become asymmetric. Therefore, the distribution automation device 130-3 located on the node 120-3 finds that, at the node 120-3, the measured voltage value of the distribution feeder 110-3 is less than the voltage threshold used for the distribution feeder 110-3, so the distribution automation device 130-3 generates a signal indicating that the distribution feeder 110-3 has a broken conductor and sends the signal to the server 140.

The server 140 receives, from the distribution automation devices 130-2 and 130-3, the signal indicating that the distribution feeder 110-3 has a broken conductor, and therefore, the server 140 determines that the distribution feeder 110-3 has a broken conductor. In addition, by means of checking, the server 140 finds that: in the neighboring nodes 120-1 and 120-2, the server 140 only receives the signal indicating that the distribution feeder 110-3 has a broken conductor from the distribution automation device 130-2 located on the node 120-2; and in the neighboring nodes 120-2 and 120-3, the server 140 receives the signal indicating that the distribution feeder 110-3 has a broken conductor from both the distribution automation device 130-2 located on the node 120-2 and the distribution automation device 130-3 located on the node 12-03. Therefore, roe server 140 determines that the broken conductor of the distribution feeder 110-3 appears between the neighboring nodes 120-1 and 12-02.

Figure 3B:
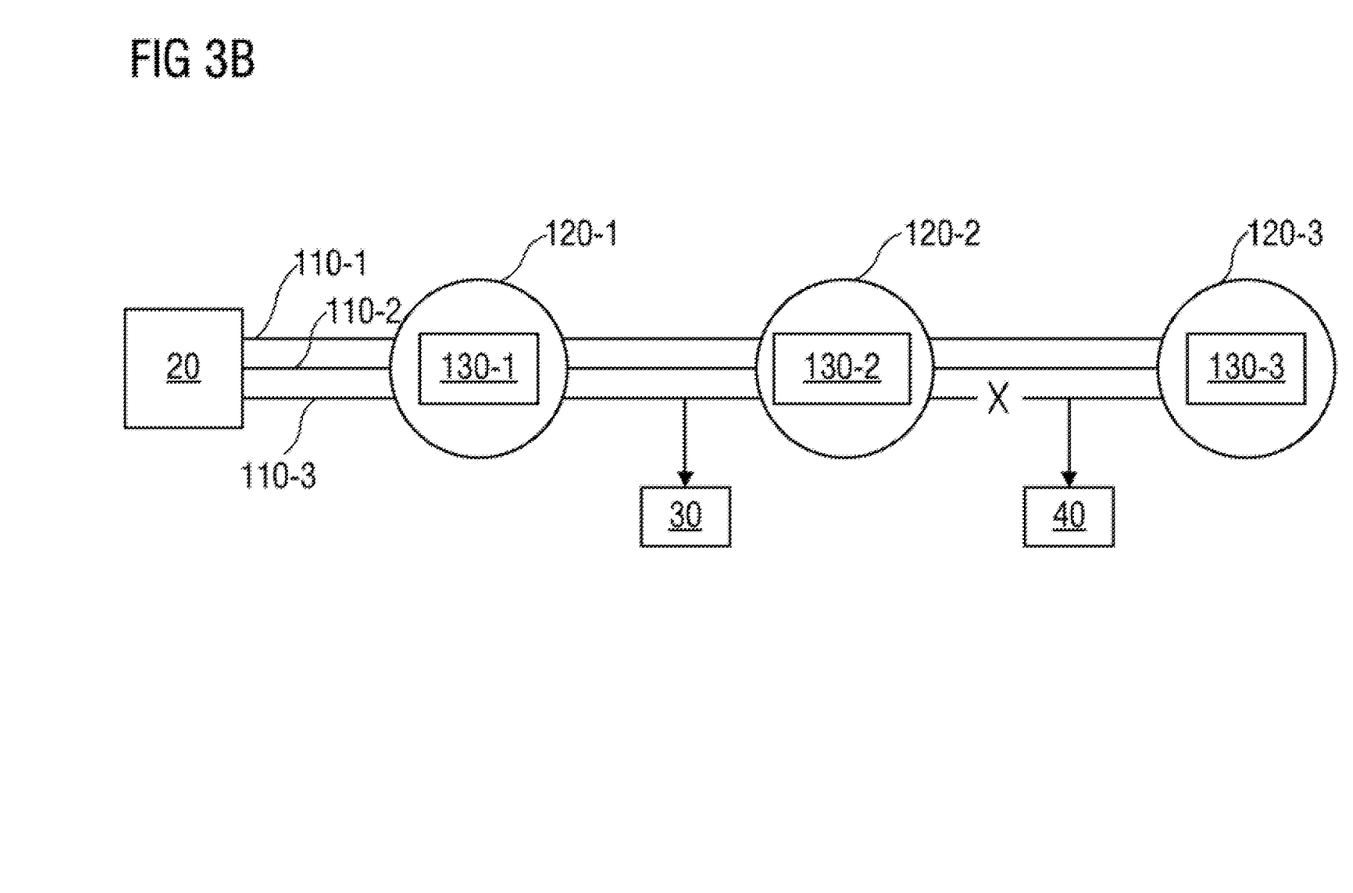
FIG. 3B shows a second example of a distribution feeder having a broken conductor.

FIG. 3B shows a second example of a distribution feeder having a broken conductor. As shown in FIG. 3B, the distribution feeder 110-3 between the node 120-2 and node 120-3 of the distribution system 10 has a broken conductor, and more specifically, the distribution feeder 110-3 between the node 120-2 and the load 40 of the distribution system 10 has a broken conductor.

Because the broken conductor of the distribution feeder 110-3 appears between the node 120-2 and the load 40 of the distribution system 10, at the nodes 120-1 and 120-2, a voltage of the distribution feeder 110-3 is not affected by the broken conductor and remains unchanged, and therefore, at the nodes 120-1 and 120-2, voltages of the three distribution feeders 110-1, 110-2, and 110-3 are still symmetric. However, at the node 120-3, the voltage of the distribution feeder 110-3 is affected by the broken conductor and becomes zero, while voltages of the distribution feeders 110-1 and 110-2 remain unchanged, and therefore, at the node 12-03, the voltages of the three distribution feeders 110-1, 110-2, and 110-3 become asymmetric.

Because the voltages of the three distribution feeders 110-1, 110-2, and 110-3 are still symmetric at the node 120-1, the distribution automation device 130-1 located on the node 120-1 finds that, at the node 120-1, the measured voltage value of each of the distribution feeders 110-1, 110-2, and 110-3 is not less than the voltage threshold thereof, and therefore, the distribution automation device 130-1 does not generate a signal indicating that a distribution feeder has a broken conductor, which means that the distribution automation device 130-1 does not send a signal indicating that the distribution feeder 110-3 has a broken conductor to the server 140.

Because the voltages of the three distribution feeders 110-1, 110-2, and 110-3 are still symmetric at the node 120-2, the distribution automation device 130-2 located on the node 120-2 finds that, at the node 120-2, the measured voltage value of each of the distribution feeders 110-2, 110-2, and 110-3 is not less than the voltage threshold thereof, and therefore, the distribution automation device 130-2 does not generate a signal indicating that a distribution feeder has a broken conductor, which means that the distribution automation device 130-2 does not send a signal indicating that the distribution feeder 130-3 has a broken conductor to the server 140.

At the node 120-3, the voltage of the distribution feeder 110-3 is affected by the broken conductor and becomes zero, while the voltages of the distribution feeders 110-1 and 110-2 remain unchanged, that is, at the node 120-3, the voltages of the three distribution feeders 110-1, 110-3, and 110-3 become asymmetric. Therefore, the distribution automation device 130-3 located on the node 120-3 finds that, at the node 120-3, the measured voltage value of the distribution feeder 110-3 is less man the voltage threshold used for the distribution feeder 110-3, so the distribution automation device 130-3 generates a signal indicating that the distribution feeder 110-3 has a broken conductor and sends the signal to the server 140.

The server 140 receives, from the distribution automation device 130-3, the signal indicating that the distribution feeder 110-3 has a broken conductor, and therefore, the server 140 determines that the distribution feeder 110-3 has a broken conductor. In addition, by means of checking, the server 140 finds that: in the neighboring nodes 120-1 and 120-2, the server 140 does not receive the signal indicating that the distribution feeder 110-3 has a broken conductor from the distribution automation device 130-1 located on the node 120-1 or the distribution automation device 130-2 located on the node 120-2; and in the neighboring nodes 120-2 and 120-3, the server 140 only receives the signal indicating that the distribution feeder 110-3 has a broken conductor from the distribution automation device 130-3 located on the node 120-3. Therefore, the server 140 determines that the broken conductor of the distribution feeder 110-3 appears between the neighboring nodes 120-2 and 12-03.

Figure 3C:
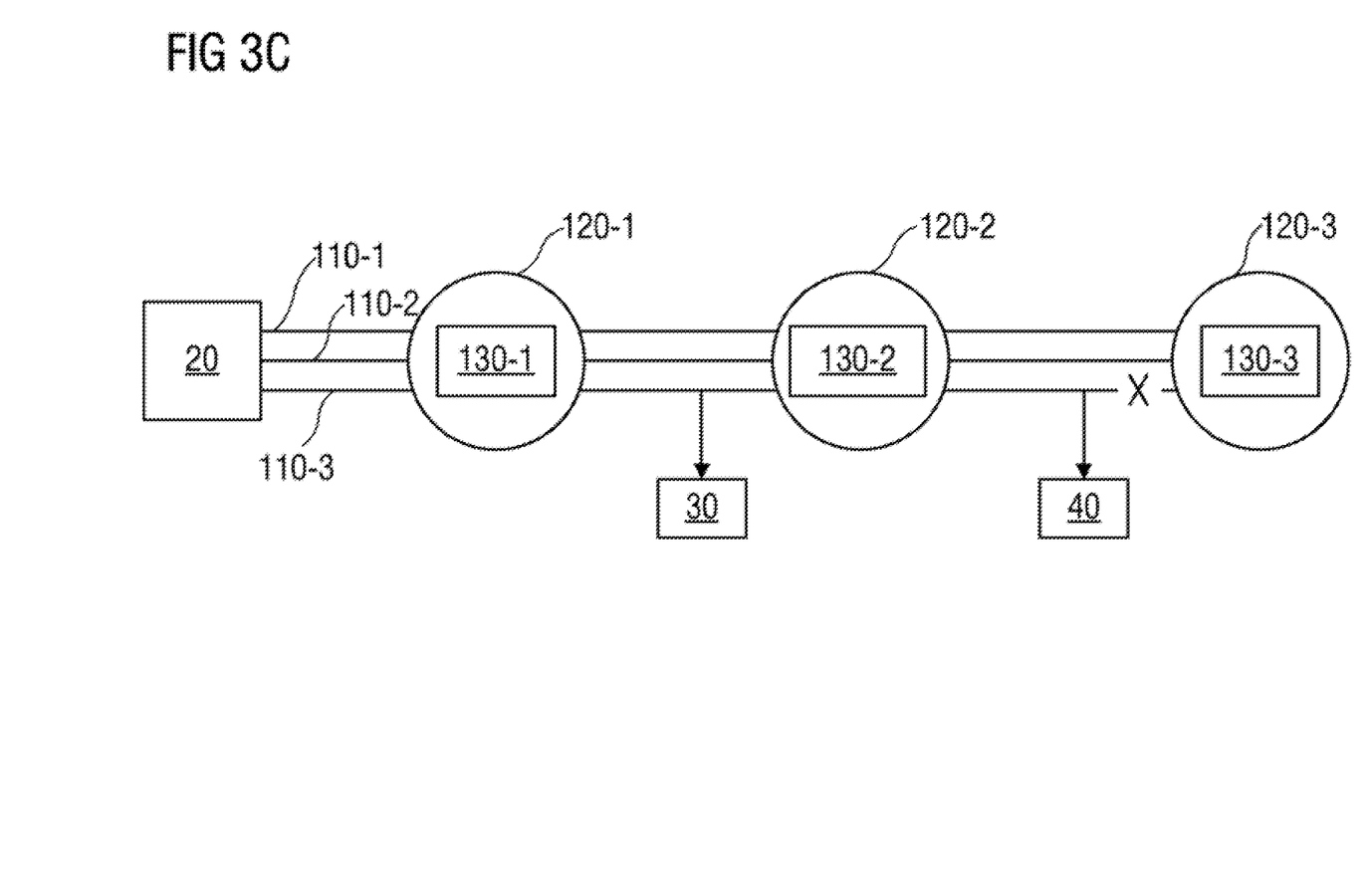
FIG. 3C shows a third example of a distribution feeder having a broken conductor.

FIG. 3C shows a third example of a distribution feeder having a broken conductor. As shown in FIG. 3C, the distribution feeder 110-3 between the node 120-2 and node 120-3 of the distribution system 10 has a broken conductor, and more specifically, the distribution feeder 110-3 between the load 40 and the node 120-3 of the distribution system 10 has a broken conductor.

Because the broken conductor of the distribution feeder 110-3 appears between the load 40 and the node 120-3 of the distribution system 10, at the nodes 120-1 and 12-02, a voltage of the distribution feeder 110-3 is not affected by the broken conductor and remains unchanged, and therefore, at the nodes 120-1 and 120-2, voltages of the three distribution feeders 110-1, 110-2, and 110-3 are still symmetric. However, at the node 120-3, the voltage of the distribution feeder 110-3 is affected by the broken conductor and becomes zero, while voltages of the distribution feeders 110-1 and 110-2 remain unchanged, and therefore, at the node 12-03, the voltages of the three distribution feeders 110-1, 110-2, and 110-3 become asymmetric.

Because the voltages of the three distribution feeders 110-1, 110-2, and 110-3 are still symmetric at the node 120-1, the distribution automation device 130-1 located on the node 120-1 finds that, at the node 120-1, the measured voltage value of each of the distribution feeders 110-1, 110-2, and 110-3 is not less than the voltage threshold thereof, and therefore, the distribution automation device 130-1 does not generate a signal indicating that a distribution feeder has a broken conductor, which means that the distribution automation device 130-1 does not send a signal indicating that the distribution feeder 110-3 has a broken conductor to the server 140.

Because the voltages of the three distribution feeders 110-1, 110-2, and 110-3 are still symmetric at the node 120-2, the distribution automation device 130-2 located on the node 120-2 finds that. at the node 120-2, the measured voltage value of each of the distribution feeders 110-2, 110-2, and 110-3 is not less than the voltage threshold thereof, and therefore, the distribution automation device 130-2 does not generate a signal indicating that a distribution feeder has a broken conductor, which means that the distribution automation device 130-2 does not send a signal indicating that the distribution feeder 110-3 has a broken conductor to the server 140.

At the node 120-3, the voltage of the distribution feeder 110-3 is affected by the broken conductor and becomes zero, while the voltages of the distribution feeders 100-1 and 110-2 remain unchanged, that is, at the node 120-3, the voltages of the three distribution feeders 110-1, 110-3, and 110-3 become asymmetric. Therefore, the distribution automation device 130-3 located on the node 120-3 finds that, at the node 120-3, the measured voltage value of the distribution feeder 110-3 is less than the voltage threshold used for the distribution feeder 110-3, so the distribution automation device 130-3 generates a signal indicating that the distribution feeder 110-3 has a broken conductor and sends the signal to the server 140.

The server 140 receives, from the distribution automation device 130-3, the signal indicating that the distribution feeder 110-3 has a broken conductor, and therefore, the server 140 determines that the distribution feeder 110-3 has a broken conductor. In addition, by means of checking, the server 140 finds that: in the neighboring nodes 120-1 and 120-2, the server 140 does not receive the signal indicating that the distribution feeder 110-3 has a broken conductor from the distribution automation device 130-1 located on the node 120-1 or the distribution automation device 130-2 located on the node 120-2; and in the neighboring nodes 120-2 and 120-3, the server 140 only receives the signal indicating that the distribution feeder 110-3 has a broken conductor from the distribution automation device 130-3 located on the node 120-3. Therefore, the server 140 determines that the broken conductor of the distribution feeder 110-3 appears between the neighboring nodes 120-2 and 12-03.

In the foregoing embodiment, broken conductor detection is performed only based on voltages of distribution feeders of a distribution system. However, in some other embodiments of the present invention, apart from the voltages of the distribution feeders, the broken conductor detection may be performed further based on currents of the distribution feeders.

Through lots of observation and research, the inventors find that: if a part of distribution feeders of a distribution system has a broken conductor, as long as the location of the broken conductor is not close to the end of the distribution system, the current flowing through a distribution feeder having the broken conductor is reduced and even becomes zero, while the current flowing through a distribution feeder not having a broken conductor basically remains unchanged. Therefore, in the case where the location of the broken conductor is not close to the end of the distribution system, the current of the distribution feeder having a broken conductor is generally smaller man a product of a mean value of currents flowing through other distribution feeders of me distribution system and a constant, where the constant may be determined by means of actual detections.

Figure 4:
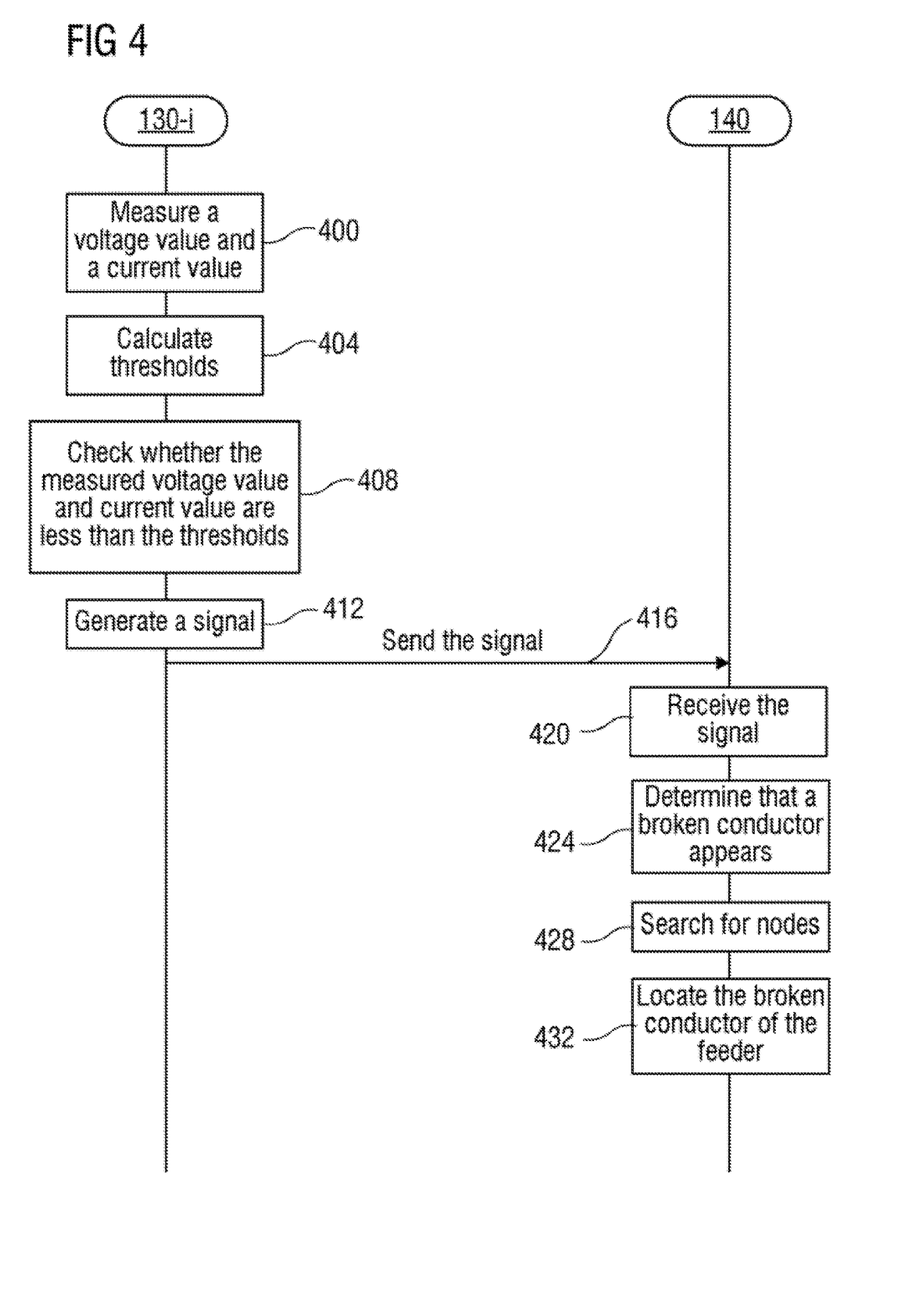
FIG. 4 is a flowchart of a broken conductor detection method according to another embodiment of the present invention.

Based on the above discovery, the present invention provides another embodiment of a broken conductor detection method. FIG. 4 shows a flowchart of a broken conductor detection method according to another embodiment.

As shown in FIG. 4, in block S400, each distribution automation device 130-$i$ of the distribution automation devices 130-1, 130-2, and 130-3 measures, at the node where it is located, respective voltage values of the distribution feeders 110-1, 110-2, and 110-3.

In block S404, the distribution automation device 130-$i$ calculates a voltage threshold and a current threshold UTH-1 used for each distribution feeder I 10-$i$ of the distribution feeders 110-1, 110-2, and 110-3, where the voltage threshold UTH-1 used for the distribution feeder 110-$i$ is equal to a product of a mean value of measured voltage values of other distribution feeders and a first constant, the current threshold UTH-1 used for the distribution feeder 110-$i$ is equal to a mean value of measured current values of other distribution feeders and a second constant, and the first constant and the second constant may be determined by means of actual detections, are greater than 0 and less than 1, and are preferably 0.1.

In block S408, the distribution automation device 130-$i$ checks whether the measured voltage value of each distribution feeder 110-$i$ of the distribution feeders 110-1, 110-2, and 110-3 is less than the voltage threshold UTH-1 used for the distribution feeder 110-$i$ and whether the measured current value of the distribution feeder 110-$i$ is less than the current threshold h used for the distribution feeder 110-$i$.

In block S412, if a checking result of block S408 indicates that a measured voltage value of a distribution feeder of the distribution feeders 110-1, 110-2. and 110-3 is less than the voltage threshold used for the distribution feeder, the distribution automation device 130-$i$ generates a voltage-detection-based signal indicating that the has a broken conductor, and if the checking result of block S408 indicates that a measured current value of a distribution feeder of the distribution feeders 110-1, 110-2, and 110-3 is less than the current threshold used for the distribution feeder, the distribution automation device 130-$i$ generates a current-detection-based signal indicating that the distribution feeder has a broken conductor.

In block S416, the distribution automation device 130-$i$ sends the generated signal to the server 140.

In block S420, the server 140 receives the signal which is sent by the distribution automation device 130-$i$ and indicates that the distribution feeder of the distribution system 10 has a broken conductor. The received signal may be a voltage-detection-based signal or a current-detection-based signal.

In S424, based on the received signal indicating that the distribution feeder of the distribution system 10 has a broken conductor, the server 140 determines that the distribution feeder has a broken conductor.

In block S428, the server 140 searches, from the nodes 120-1, 120-2, and 120-3, two neighboring nodes satisfying the following condition: the server 140 receives the voltage-detection-based signal indicating that the distribution feeder has a broken conductor from a distribution automation device located on one of the two neighboring nodes, and does not receive the voltage-detection-based signal indicating that the distribution feeder has a broken conductor from a distribution automation device located on the other of the two neighboring nodes, that is, the server 140 only receives the voltage-detection-based signal indicating that the distribution feeder has a broken conductor from a distribution automation device located on one of the two neighboring nodes.

In block S432, the server 140 determines that the broken conductor of the distribution feeder appears between the two neighboring nodes found.

The following describes a process of detecting, by using the method shown in FIG. 4, the broken conductor shown in FIG. 3 A.

Because the broken conductor of the distribution feeder 110-3 appears between the node 120-1 and node 12-02 of the distribution system 10, at the node 120-1, a voltage of the distribution feeder 110-3 is not affected by the broken conductor and remains unchanged, and therefore, at the node 120-1, voltages of the three distribution feeders 110-1, 110-2, and 110-3 are still symmetric. However, at the node 12-02 and node 12-03, the voltage of the distribution feeder 110-3 is affected by the broken conductor and becomes zero, while voltages of the distribution feeders 110-1 and 110-2 remain unchanged, and therefore, at the node 120-3 and node 120-2, the voltages of the three distribution feeders 110-1, 110-2, and 110-3 become asymmetric.

In addition, because the broken conductor of the distribution feeder 110-3 appears between the node 12-01 and node 12-02 (more specifically, between the node 12-01 and the load 30) of the distribution system 10. at the nodes 120-1 and 120-2, a current of the distribution feeder 110-3 is affected by the broken conductor and becomes zero, and at the node 120-3, the current of the distribution feeder 110-3 is not affected by the broken conductor and is still zero; however, at the nodes 120-1, 12-02, and 120-3, currents of the distribution feeders 110-1 and 110-2 remain unchanged (where at the node 120-3, me currents of the distribution feeders 110-1 and 110-2 are both zero); therefore, at the nodes 120-1 and 120-2, the currents of the three distribution feeders 110-1, 110-2, and 110-3 become asymmetric, but at the node 120-3, the currents of the three distribution feeders 110-1, 110-2, and 110-3 are still symmetric.

Because the voltages of the three distribution feeders 110-1, 110-2, and 110-3 are still symmetric at the node 120-1, the distribution automation device 130-1 located on the node 120-1 finds that, at the node 120-1, the measured voltage value of each of the distribution feeders 110-1, 110-2, and 110-3 is not less than the voltage threshold thereof, and therefore, the distribution automation device 130-1 does not generate a voltage-detection-based signal indicating that a distribution feeder has a broken conductor, which means that the distribution automation device 130-1 does not send a voltage-detection-based signal indicating that the distribution feeder 110-3 has a broken conductor to the server 140. However, because at the node 120-1. the currents of the three distribution feeders 110-1, 110-2, and 110-3 become asymmetric (where the current of the distribution feeder 110-3 becomes zero), the distribution automation device 130-1 located on the node 120-1 finds that, at the node 120-1, the measured current value of the distribution feeder 110-3 is less than the current threshold used for the distribution feeder 110-3, and therefore, the distribution automation device 130-1 generates a current-detection-based signal indicating that the distribution feeder 110-3 has a broken conductor, and sends the signal to the server 140.

At the node 120-2, the voltage and current of the distribution feeder 110-3 are affected by the broken conductor and become zero, while the voltages and currents of the distribution feeders 110-1 and 110-2 remain unchanged, that is, at the node 120-2, the voltages and currents of the three distribution feeders 110-1, 110-3, and 110-2 become asymmetric. Therefore, the distribution automation device 130-2 located on the node 120-2 finds that, at the node 120-2, the measured voltage value and current value of the distribution feeder 110-3 are less than the voltage threshold and the current threshold used for the distribution feeder distribution feeder 110-3, respectively, so the distribution automation device 130-2 generates a voltage-detection-based signal indicating that the distribution feeder 110-3 has a broken conductor and a current-detection-based signal indicating that the distribution feeder 110-3 has a broken conductor, and sends the signals to the server 140.

At the node 120-3, the voltage of the distribution feeder 110-3 is affected by the broken conductor and becomes zero; white the voltages of the distribution feeders 110-1 and 110-2 remain unchanged, that is, at the node 120-3, the voltages of the three distribution feeders 110-1, 110-3, and 110-3 become asymmetric. Therefore, the distribution automation device 130-3 located on the node 120-3 finds that, at the node 120-3, the measured voltage value of the distribution feeder 110-3 is less man the voltage threshold used for the distribution feeder 110-3, so the distribution automation device 130-3 generates a voltage-detection-based signal indicating that the distribution feeder 110-3 has a broken conductor and sends the signal to the server 140. In addition, because the currents of the three distribution feeders 110-3, 110-2, and 110-3 at the node 120-2 are all zero, the distribution automation device 130-3 located on the node 120-3 finds that, at the node 120-3, the measured current value of each of the distribution feeders 110-3, 110-2, and 110-3 is not less than the current threshold thereof, and therefore, the distribution automation device 130-3 does not generate a current-detection-based signal indicating that a distribution feeder has a broken conductor, which means that the distribution automation device 130-3 does not send a current-detection-based signal indicating that the distribution feeder 110-3 has a broken conductor to the server 140.

The server 140 receives, from the distribution automation devices 130-2 and 130-3, the voltage-detection-based signal indicating that the distribution feeder 110-3 has a broken conductor, and receives, from the distribution automation devices 130-1 and 130-2, the current-detection-based signal indicating that the distribution feeder 110-3 has a broken conductor. Therefore, the server 140 determines that the distribution feeder 110-3 has a broken conductor. In addition, by means of checking, the server 140 finds that; in the neighboring nodes 120-1 and 120-2, the server 140 only receives the voltage-detection-based signal indicating that the distribution feeder 110-3 has a broken conductor from the distribution automation device 130-2 located on the node 12-02; and in the neighboring nodes 120-2 and 120-3, the server 140 receives the voltage-detection-based signal indicating that the distribution feeder 110-3 has a broken conductor from both the distribution automation device 130-2 located on the node 120-2 and the distribution automation device 130-3 located on the node 12-03. Therefore, the server 140 determines that the broken conductor of the distribution feeder 110-3 appears between the neighboring nodes 120-1 and 12-02.

The following describes a process of detecting, by using the method shown in FIG. 4, the broken conductor shown in FIG. 3B.

Because the broken conductor of the distribution feeder 110-3 appears between the node 120-2 and the load 40 of the distribution system 10, at the nodes 120-1 and 120-2, a voltage of the distribution feeder 110-3 is not affected by the broken conductor and remains unchanged, and therefore, at the nodes 120-1 and 12-02, voltages of the three distribution feeders 110-1, 110-2, and 110-3 are still symmetric. However, at the node 120-3, the voltage of the distribution feeder 110-3 is affected by the broken conductor and becomes zero, while voltages of the distribution feeders 110-1 and 110-2 remain unchanged, and therefore, at the node 12-03, the voltages of the three distribution feeders 110-1, 110-2, and 110-3 become asymmetric.

In addition, because the broken conductor of the distribution feeder 110-3 appears between the node 120-2 and the load 40 of the distribution system 10, at the node 120-1, a current of the distribution feeder 110-3 is affected by the broken conductor and decreases; at the node 120-2, the current of the distribution feeder 110-3 is affected by the broken conductor and becomes zero; and at the node 120-3, the current of the distribution feeder 110-3 is not affected by the broken conductor and is still zero; however, at the nodes 12-01, 120-2, and 120-3, currents of the distribution feeders 110-1 and 110-2 remain unchanged (where at the node 120-3, the currents of the distribution feeders 110-1 and 110-2 are both zero). Therefore, at the nodes 120-1 and 120-2, the currents of the three distribution feeders 110-1, 110-2, and 110-3 become asymmetric, but at the node 12-03, the currents of the three distribution feeders 110-1, 110-2, and 110-3 are still symmetric.

Because the voltages of the three distribution feeders 110-1, 110-2, and 110-3 are still symmetric at the node 120-1, the distribution automation device 130-1 located on the node 120-1 finds that, at the node 120-1, the measured voltage value of each of the distribution feeders 110-1, 110-2, and 110-3 is not less than the voltage threshold thereof, and therefore, the distribution automation device 130-1 does not generate a voltage-detection-based signal indicating that a distribution feeder has a broken conductor, which means that the distribution automation device 130-1 does not send a voltage-detection-based signal indicating that the distribution feeder 110-3 has a broken conductor to the server 140. However, because at the node 120-1, the currents of the three distribution feeders 110-1, 110-2, and 110-3 become asymmetric (where the current of the distribution feeder 110-3 decreases), the distribution automation device 130-1 located on the node 120-1 finds that, at the node 120-1, the measured current value of the distribution feeder 110-3 is less than the current threshold used for the distribution feeder 110-3, and therefore, the distribution automation device 130-1 generates a current-detection-based signal indicating that the distribution feeder 110-3 has a broken conductor, and sends the signal to the server 140.

Because the voltages of the three distribution feeders 110-1, 110-2, and 110-3 are still symmetric at the node 120-2, the distribution automation device 130-2 located on the node 120-2 finds that, at the node 120-2, the measured voltage value of each of the distribution feeders 110-2, 110-2, and 110-3 is not less than the voltage threshold thereof, and therefore, the distribution automation device 130-2 does not generate a signal indicating that a distribution feeder has a broken conductor, which means that the distribution automation device 130-2 does not send a signal indicating that the distribution feeder 110-3 has a broken conductor to the server 140. However, because at the node 120-2, the currents of the three distribution feeders 110-1, 110-2, and 110-3 become asymmetric (where the current of the distribution feeder 110-3 becomes zero), the distribution automation device 130-2 located on the node 120-2 finds that, at the node 120-2, the measured current value of the distribution feeder 110-3 is less than the current threshold used for the distribution feeder 110-3, and therefore, the distribution automation device 130-2 generates a current-detection-based signal indicating that the distribution feeder 110-3 has a broken conductor, and sends the signal to the server 140.

At the node 120-3, the voltage of the distribution feeder 110-3 is affected by the broken conductor and becomes zero; white the voltages of the distribution feeders 110-1 and 110-2 remain unchanged, that is, at the node 120-3, the voltages of the three distribution feeders 110-1, 110-3, and 110-3 become asymmetric. Therefore, the distribution automation device 130-3 located on the node 120-3 finds that, at the node 120-3, the measured voltage value of the distribution feeder 110-3 is less man the voltage threshold used for the distribution feeder 110-3, so the distribution automation device 130-3 generates a voltage-detection-based signal indicating that the distribution feeder 110-3 has a broken conductor and sends the signal to the server 140. In addition, because the currents of the three distribution feeders 110-3, 110-2, and 110-3 are all zero at the node 120-3, the distribution automation device 130-3 located on the node 12-03 finds that, at the node 120-3, the measured current value of each of the distribution feeders 110-3, 110-2, and 110-3 is not less than the current threshold thereof, and therefore, the distribution automation device 130-3 does not generate a current-detection-based signal indicating that a distribution feeder has a broken conductor, which means that the distribution automation device 130-3 does not send a current-detection-based signal indicating that the distribution feeder 110-3 has a broken conductor to the server 140.

The server 140 receives, from the distribution automation device 130-3, the voltage-detection-based signal indicating that the distribution feeder 110-3 has a broken conductor, and receives, from the distribution automation devices 130-1 and 130-2, the current-detection-based signal indicating that the distribution feeder 110-3 has a broken conductor. Therefore, the server 140 determines that the distribution feeder 110-3 has a broken conductor. In addition, by means of checking, the server 140 finds that; in the neighboring nodes 120-1 and 120-2, the server 140 does not receive the voltage-detection-based signal indicating that the distribution feeder 110-3 has a broken conductor from the distribution automation device 130-1 located on the node 120-1 or the distribution automation device 130-2 located on the node 120-2; and in the neighboring nodes 120-2 and 120-3, the server 140 only receives the voltage-detection-based signal indicating that the distribution feeder 110-3 has a broken conductor from the distribution automation device 130-3 located on the node 12-03. Therefore, the server 140 determines that the broken conductor of the distribution feeder 110-3 appears between the neighboring nodes 120-2 and 12-03.

The following describes a process of detecting, by using the method shown in FIG. 4, the broken conductor shown in FIG. 3C.

Because the broken conductor of the distribution feeder 110-3 appears between the load 40 and the node 120-3 of the distribution system 10, at the nodes 120-1 and 120-2, a voltage of the distribution feeder 110-3 is not affected by the broken conductor and remains unchanged-, and therefore, at the nodes 120-1 and 12-02, voltages of the three distribution feeders 110-1, 110-2, and 110-3 are still symmetric. However, at the node 120-3, the voltage of the distribution feeder 110-3 is affected by the broken conductor and becomes zero, while voltages of the distribution feeders 110-1 and 110-2 remain unchanged, and therefore, at the node 12-03, the voltages of the three distribution feeders 110-1, 110-2, and 110-3 become asymmetric.

In addition, because the broken conductor of the distribution feeder 110-3 appears between the toad 40 and the node 120-3 of the distribution system 10, at the nodes 120-1 and 120-2, a current of the distribution feeder 110-3 is not affected by the broken conductor and remains unchanged, at the node 120-3, the current of the distribution feeder 110-3 is not affected by the broken conductor and is still zero, and at the nodes 120-1, 12-02, and 120-3, currents of the three distribution feeders 110-1 and 110-2 remain unchanged (where at the node 120-3, the currents of the distribution feeders 110-1 and 110-2 are both zero). Therefore, at the nodes 120-1, 120-2, and 120-3, the currents of the three distribution feeders 110-1, 110-2, and 110-3 are still symmetric.

Because the voltages and currents of the three distribution feeders 1 !O-I, 110-2, and 110-3 are still symmetric at the node 120-1, the distribution automation device 130-1 located on the node 120-1 finds that, at the node 120-1, the measured voltage value and current value of each of the distribution feeders 110-1, 110-2, and 110-3 are not less than the voltage threshold and current threshold thereof*respectively, and therefore, the distribution automation device 130-1 does not generate a voltage-detection-based signal indicating that a distribution feeder has a broken conductor or a current-detection-based signal indicating that a distribution feeder has a broken conductor, which means that the distribution automation device 130-1 does not send a voltage-detection-based signal indicating that the distribution feeder 110-3 has a broken conductor or a current-detection-based signal indicating that the distribution feeder 110-3 has a broken conductor to the server 140.

Because the voltages and currents of the three distribution feeders 110-1, 110-2, and 110-3 are still symmetric at the node 120-2, the distribution automation device 130-2 located on the node 120-2 finds that, at the node 120-2, the measured voltage value and current value of each of the distribution feeders 110-2, 110-2, and 110-3 are not less than the voltage threshold and current threshold thereof, respectively, and therefore, the distribution automation device 130-2 does not generate a signal indicating that a distribution feeder has a broken conductor, which means that the distribution automation device 130-2 does not send a voltage-detection-based signal indicating that the distribution feeder 110-3 has a broken conductor or a current-detection-based signal indicating that the distribution feeder 110-3 has a broken conductor to the server 140.

At the node 120-3, the voltage of the distribution feeder 110-3 is affected by the broken conductor and becomes zero, while the voltages of the distribution feeders 110-1 and 110-2 remain unchanged, that is, at the node 120-3, the voltages of the three distribution feeders 110-1, 110-3, and 110-3 become asymmetric. Therefore, the distribution automation device 130-3 located on the node 120-3 finds that, at the node 120-3, the measured voltage value of the distribution feeder 110-3 is less than the voltage threshold used for the distribution feeder 110-3 so the distribution automation device 130-3 generates a voltage-detection-based signal indicating that the distribution feeder 110-3 has a broken conductor and sends the signal to the server 140. In addition, because the currents of the three distribution feeders 110-3, 110-2, and 110-3 are all zero at the node 120-2, the distribution automation device 130-3 located on the node 12-03 finds that, at the node 120-3, the measured current value of each of the distribution feeders 110-3, 110-2, and 110-3 is not less than the current threshold thereof, and therefore, the distribution automation device 130-3 does not generate a current-detection-based signal indicating that a distribution feeder has a broken conductor, which means that the distribution automation device 130-2 does not send a current-detection-based signal indicating that the distribution feeder 110-3 has a broken conductor to the server 140.

The server 140 receives, from the distribution automation device 130-3, the voltage-detection-based signal indicating that the distribution feeder 110-3 has a broken conductor, and therefore, the server 140 determines that the distribution feeder 110-3 has a broken conductor. In addition, by means of checking, the server 140 finds that in the neighboring nodes 120-1 and 120-2. the server 140 does not receive the voltage-detection-based signal indicating that the distribution feeder 110-3 has a broken conductor from the distribution automation device 130-1 located on the node 12-01 or the distribution automation device 130-2 located on the node 120-2; and in the neighboring nodes 120-2 and 120-3, the server 140 only receives the voltage-detection-based signal indicating that the distribution feeder 110-3 has a broken conductor from the distribution automation device 130-3 located on the node 12-03. Therefore, the server 140 determines that the broken conductor of the distribution feeder 110-3 appears between the neighboring nodes 120-2 and 12-03.

A person skilled in the art should understand that, although the distribution system 10 only includes three distribution feeders in the foregoing embodiments, the present invention is not limited thereto. In some other embodiments of the present invention, the distribution system 10 may also include more than three distribution feeders.

A person skilled in the art should understand that, although the distribution system 10 only includes three nodes in the foregoing embodiments, the present invention is not limited thereto. In some other embodiments of the present invention, the distribution system 10 may also include more man three nodes.

A person skilled in the art should understand that, although the foregoing embodiments include operations of blocks S228 to S232 or blocks S428 to S432 to locate a broken conductor, the present invention is not limited thereto. In some other embodiments of the present invention, if the broken conductor does not need to be located the present invention may exclude the operations of blocks S228 to S232 or blocks S428 to S432.

A person skilled in the art should understand that, the server 140 may be a device independent of the distribution automation devices 130-1, 130-2, and 130-3 or may be one of the distribution automation devices 130-1, 130-2, and 130-3.

Figure 5:
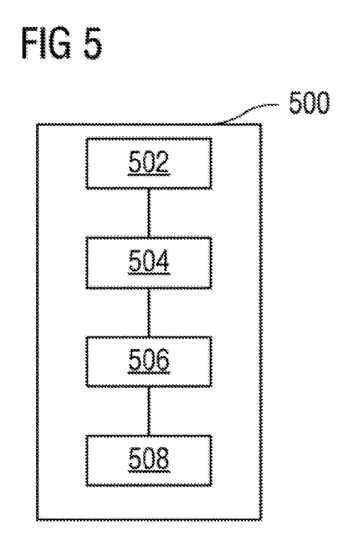
FIG. 5 is a schematic diagram of a broken conductor detection apparatus according to an embodiment of the present invention.

FIG. 5 is a schematic diagram of a broken conductor detection apparatus according to an embodiment of the present invention. The apparatus shown in FIG. 5 may be implemented by software, hardware, or a combination thereof, and can be installed in a distribution automation device on a node of the distribution system 10.

As shown in FIG. 5, a broken conductor detection apparatus 500 includes a measurement module 502, a check module 504, a generating module 506, and a sending module 508. The measurement module 502 is used to measure, at one node of a distribution system (namely, a node where the apparatus 500 is located), a voltage value of each distribution feeder of the distribution system. The check module 504 is used to check whether the measured voltage value of each distribution feeder T of the distribution system is less than a voltage threshold used for the distribution feeder T, the voltage threshold used for the distribution feeder T being calculated based on a mean value of measured voltage values of other distribution feeders in the distribution system. The generating module 506 is used to: if a checking result indicates that a measured voltage value of some distribution feeder of the distribution system is less than the voltage threshold used for the distribution feeder, generate a signal indicating that the distribution feeder of the distribution system has a broken conductor. The sending module 508 is used to send the generated signal.

In an implementation manner the signal is a voltage-detection-based signal indicating that the distribution feeder has a broken conductor; the measurement module 502 is further used to measure, at the node, a current value of each distribution feeder of the distribution system; the check module 504 is further used to check whether the measured current value of the distribution feeder T is less than a current threshold used for the distribution feeder T, the current threshold used for the distribution feeder T being calculated based on a mean value of measured current values of other distribution feeders in the distribution system; the generating module 506 is further used to: if a checking result indicates that a measured current value of a distribution feeder in the distribution system is less than the current threshold used for the distribution feeder, generate a current-detection-based signal indicating that the distribution feeder has a broken conductor; and the sending module 508 is further used to send the generated current-detection-based signal indicating that the distribution feeder has a broken conductor.

Figure 6:
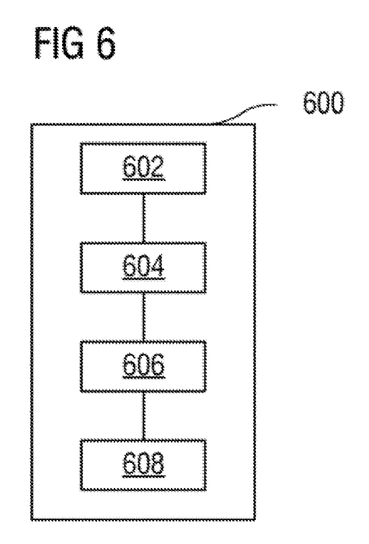
FIG. 6 is a schematic diagram of a broken conductor detection apparatus according to an embodiment of the present invention.

FIG. 6 is a schematic diagram of a broken conductor detection apparatus according to an embodiment of the present invention. The apparatus shown in FIG. 6 may be implemented by software, hardware, or a combination thereof, and can be installed in a server 140.

As shown in FIG. 6, a broken conductor detection apparatus 600 includes a receiving module 602, a judging module 604, a search module 606, and a determining module 608. The receiving module 602 is used to receive, from at least one device of devices located at nodes of a distribution system, a signal indicating that a distribution feeder of the distribution system has a broken conductor. The judging module 604 is used to determine, based on the signal received by the receiving module 602, that a distribution feeder in the distribution system has a broken conductor. The search module 606 is used to search, from all the nodes of the distribution system, for two neighboring nodes satisfying the following condition: the signal indicating that the distribution feeder has a broken conductor is only received from one of the two neighboring nodes. The determining module 60S is used to determine that the broken conductor of the distribution feeder appears between the two nodes found.

In an implementation manner, the signal received by the receiving module 602 includes a voltage-detection-based signal indicating that the distribution feeder has a broken conductor and a current-detection-based signal indicating that the distribution feeder has a broken conductor; and the two nodes found satisfy the following condition: the voltage-detection-based signal indicating that the distribution feeder has a broken conductor is only received from one of the two nodes found.

Figure 7:
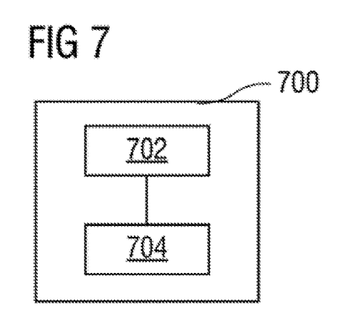
FIG. 7 is a schematic diagram of a broken conductor detection device according to an embodiment of the present invention.

FIG. 7 is a schematic diagram of a broken conductor detection device according to an embodiment of the present invention. As shown in FIG. 7, a broken conductor detection device 700 includes a memory 702 and a processor 704 connected to the memory 702, where the processor is used to execute the operations executed by the modules of the apparatus 500 or 600.

An embodiment of the present invention further provides a machine readable medium, which stores an executable instruction, and when the executable instruction is executed, enables the machine to implement the functions of the processor.

A person skilled in the art should understand that variations and modifications can be made to the above disclosed embodiments without departing from the substance of the present invention. Therefore, the protection scope of the present invention shall be subject to the appended claims.

What is claimed is:

1. A broken conductor detection method comprising:
receiving, from at least one of a plurality of devices located at nodes of a distribution system respectively, a signal indicating that a measured voltage of a distribution feeder of the distribution system is less than a voltage threshold used for the distribution feeder system and includes a broken conductor;
determining, based on the received signal, that the distribution feeder in the distribution system includes a broken conductor;
searching, from all the nodes of the distribution system, for two neighboring nodes wherein the signal indicating that the distribution feeder includes the broken conductor is only received from one of the two neighboring nodes; and
determining that the broken conductor of the distribution feeder appears between the two neighboring nodes, wherein
the voltage threshold used for the distribution feeder is calculated based on a mean value of measured voltage values of other distribution feeders in the distribution system.

2. The method of claim 1, wherein the received signal comprises a voltage-detection-based signal indicating that said distribution feeder includes a broken conductor and a current-detection-based signal indicating that the distribution feeder includes a broken conductor, and wherein for the two neighboring nodes, the voltage-detection-based signal indicating that the distribution feeder includes a broken conductor is only received from one of the two neighboring nodes.

3. A broken conductor detection device, comprising:
a memory; and
one or more processors, coupled to the memory, to execute the method of claim 1.

4. A non-transitory machine readable medium, storing executable instructions which, when executed by one or more processors, enable a machine to execute the method of claim 1.

5. The method of claim 1, wherein the received signal is received at a server operatively connected to the distribution system.

6. The method of claim 1, wherein the plurality of devices are connected in series.

7. A broken conductor detection apparatus, comprising:
memory storing computer-readable instructions; and
one or more processors configured to execute the computer-readable instructions such that the one or more processors are configured to perform operations including,
receiving, from at least one device of a plurality of devices respectively located at respective nodes of a distribution system, a signal indicating that a measured voltage of a distribution feeder of the distribution system includes a broken conductor;
determining, based on the received signal, that the distribution feeder in the distribution system is less than a voltage threshold used for the distribution feeder system and includes a broken conductor;
searching, from all the nodes of the distribution system, for two neighboring nodes, wherein the signal indicating that the distribution feeder includes a broken conductor is only received from one of the two neighboring node; and
determining that the broken conductor of the distribution feeder appears between the two neighboring nodes, wherein
the voltage threshold used for the distribution feeder is calculated based on a mean value of measured voltage values of other distribution feeders in the distribution system.

8. The apparatus of claim 7, wherein
the received signal comprises a voltage-detection-based signal indicating that the distribution feeder includes a broken conductor and a current-detection-based signal indicating that the distribution feeder includes a broken conductor, and wherein
for the two neighboring node, the voltage-detection-based signal indicating that the distribution feeder includes a broken conductor is only received from one of the two neighboring nodes.

* * * * *